(12) United States Patent  (10) Patent No.: US 8,106,579 B2
Otsuka  (45) Date of Patent: Jan. 31, 2012

(54) SEMICONDUCTOR LIGHT EMITTING DEVICE

(75) Inventor: Kazuaki Otsuka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 11/931,022

(22) Filed: Oct. 31, 2007

(65) Prior Publication Data

US 2008/0129190 A1    Jun. 5, 2008

(30) Foreign Application Priority Data

Oct. 31, 2006  (JP) ................................. 2006-296620
Oct. 22, 2007  (JP) ................................. 2007-274192

(51) Int. Cl.
 *H01J 1/62*  (2006.01)
 *H01J 63/04*  (2006.01)
(52) U.S. Cl. .......................................... 313/503; 257/98
(58) Field of Classification Search .............. 313/503, 313/483, 501, 502; 252/301.4 R; 257/98
See application file for complete search history.

(56) References Cited

U.S. PATENT DOCUMENTS

| | | | | |
|---|---|---|---|---|
| 6,621,211 B1 * | 9/2003 | Srivastava et al. | ............. | 313/503 |
| 6,939,481 B2 * | 9/2005 | Srivastava et al. | ...... | 252/301.4 R |
| 7,138,965 B2 * | 11/2006 | Shiiki et al. | ...................... | 345/60 |
| 7,221,083 B2 * | 5/2007 | Oaku et al. | ..................... | 313/485 |
| 7,573,072 B2 * | 8/2009 | Setlur et al. | ..................... | 257/98 |
| 2003/0222268 A1 * | 12/2003 | Yocom et al. | ................... | 257/98 |
| 2004/0135504 A1 | 7/2004 | Tamaki et al. | | |
| 2005/0194604 A1 | 9/2005 | Sakuma et al. | | |
| 2005/0199897 A1 * | 9/2005 | Setlur et al. | ...................... | 257/98 |
| 2005/0253500 A1 | 11/2005 | Gotoh et al. | | |
| 2006/0022208 A1 * | 2/2006 | Kim et al. | ......................... | 257/98 |
| 2006/0076883 A1 * | 4/2006 | Himaki et al. | ................ | 313/503 |
| 2007/0029565 A1 * | 2/2007 | Masuda et al. | .................. | 257/98 |
| 2007/0075620 A1 * | 4/2007 | Hildenbrand | ................. | 313/486 |
| 2007/0132366 A1 | 6/2007 | Yabe et al. | | |
| 2007/0241666 A1 * | 10/2007 | Jang et al. | ..................... | 313/503 |
| 2008/0017831 A1 * | 1/2008 | Tamatani et al. | ...... | 252/301.4 R |
| 2008/0035943 A1 * | 2/2008 | Slutsky et al. | .................. | 257/98 |
| 2008/0036364 A1 * | 2/2008 | Li et al. | ........................ | 313/503 |

FOREIGN PATENT DOCUMENTS

| | | |
|---|---|---|
| JP | 2005-252250 | 9/2005 |
| WO | WO 2006098450 A1 * | 9/2006 |
| WO | WO 2006106883 A1 * | 10/2006 |

* cited by examiner

*Primary Examiner* — Nimeshkumar Patel
*Assistant Examiner* — Glenn Zimmerman
(74) *Attorney, Agent, or Firm* — Turocy & Watson, LLP (57) ABSTRACT

A semiconductor light emitting device includes: a semiconductor light emitting element; a first phosphor which absorbs light emitted from the semiconductor light emitting element and emits first wavelength-converted light; and a second phosphor which absorbs light emitted from the semiconductor light emitting element and emits second wavelength-converted light. The first phosphor has a first excitation spectrum region where excitation intensity increases with increasing wavelength around a peak wavelength of the semiconductor light emitting element. The second phosphor has a second excitation spectrum region where excitation intensity is flat or decreases with respect to increasing wavelength around the peak wavelength of the semiconductor light emitting element.

8 Claims, 11 Drawing Sheets

A: SEMICONDUCTOR LIGHT EMITTING ELEMENT
B: SEMICONDUCTOR LIGHT EMITTING DEVICE INCLUDING PHOSPHOR OF FIG. 2A
C: SEMICONDUCTOR LIGHT EMITTING DEVICE INCLUDING PHOSPHOR OF FIG. 2A WITH VARIATION TO LONG-WAVELENGTH SIDE
D: SEMICONDUCTOR LIGHT EMITTING DEVICE INCLUDING PHOSPHOR OF FIG. 2B WITH VARIATION TO LONG-WAVELENGTH SIDE

FIG. 3

■ LIGHT FROM YELLOW PHOSPHOR
● LIGHT FROM BLUE SEMICONDUCTOR LIGHT EMITTING ELEMENT
□ WH

A: SEMICONDUCTOR LIGHT EMITTING ELEMENT
B: SEMICONDUCTOR LIGHT EMITTING DEVICE INCLUDING PHOSPHOR OF FIG. 2A
C: SEMICONDUCTOR LIGHT EMITTING DEVICE INCLUDING PHOSPHOR OF FIG. 2A WITH VARIATION TO LONG-WAVELENGTH SIDE DUE TO TEMPERATURE INCREASE
D: SEMICONDUCTOR LIGHT EMITTING DEVICE INCLUDING PHOSPHOR OF FIG. 2B WITH VARIATION TO LONG-WAVELENGTH SIDE DUE TO TEMPERATURE INCREASE

SEMICONDUCTOR LIGHT EMITTING DEVICE

CROSS-REFERENCE TO RELATED APPLICATIONS

This application is based upon and claims the benefit of priorities from the prior Japanese Application No. 2006-296620, file on Oct. 31, 2006, and the prior Japanese Application No. 2007-274192, file on Oct. 22, 2007; the entire contents of which are incorporated herein by reference.

BACKGROUND OF THE INVENTION

1. Field of the Invention

This invention relates to a semiconductor light emitting device.

2. Background Art

The semiconductor light emitting device, which emits mixed color of blue light from a nitride semiconductor light emitting element and yellow light obtained through wavelength conversion by phosphors, is finding wide application in displays, illuminations, and display backlights.

The semiconductor light emitting element includes a quantum well structure made of compound semiconductor thin films. It is not easy to control the composition and thickness of a heterojunction of compound semiconductor thin films having a thickness of approximately several nm. Hence the emission wavelength of a semiconductor light emitting element has a certain distribution.

On the other hand, the excitation spectrum of phosphors depends on wavelength. Consequently, if the emission wavelength of a semiconductor light emitting element varies several nm, the excitation intensity of phosphors also varies accordingly, changing the chromaticity of the mixed color.

JP-A 2005-252250 (kokai) discloses a light emitting device using an LED (light emitting diode) or LD (laser diode) with a peak wavelength of 380 to 410 nm as an excitation light source. In this device, despite some shift in its emission wavelength, the emission intensity of the red phosphor is not affected, keeping not only the brightness, but also the balance of mixing with blue and green phosphor.

SUMMARY

According to an aspect of the invention, there is provided a semiconductor light emitting device including: a semiconductor light emitting element; a first phosphor which absorbs light emitted from the semiconductor light emitting element and emits first wavelength-converted light; and a second phosphor which absorbs light emitted from the semiconductor light emitting element and emits second wavelength-converted light, the first phosphor having a first excitation spectrum region where excitation intensity increases with increasing wavelength around a peak wavelength of the semiconductor light emitting element, and the second phosphor having a second excitation spectrum region where excitation intensity is flat or decreases with respect to increasing wavelength around the peak wavelength of the semiconductor light emitting element.

According to another aspect of the invention, there is provided a semiconductor light emitting device including: a semiconductor light emitting element; a first phosphor which absorbs light emitted from the semiconductor light emitting element and emits first wavelength-converted light; and a second phosphor which absorbs light emitted from the semiconductor light emitting element and emits second wave-length-converted light, the first phosphor having a first excitation spectrum region where excitation intensity increases with increasing wavelength around a peak wavelength of the semiconductor light emitting element, the second phosphor having a second excitation spectrum region where a excitation intensity is flat or decreases with respect to increasing wavelength around the peak wavelength of the semiconductor light emitting element, excitation intensity resulting from mixing the first phosphor and the second phosphor having a third excitation spectrum region which is flat or increases with respect to increasing wavelength, and an upper limit of the peak wavelength falling within the third excitation spectrum region.

According to another aspect of the invention, there is provided a semiconductor light emitting device including: a semiconductor light emitting element; a first phosphor which absorbs light emitted from the semiconductor light emitting element and emits first wavelength-converted light; a second phosphor which absorbs light emitted from the semiconductor light emitting element and emits second wavelength-converted light; a third phosphor which absorbs light emitted from the semiconductor light emitting element and emits third wavelength-converted light; and a fourth phosphor which absorbs light emitted from the semiconductor light emitting element and emits forth wavelength-converted light, the first phosphor having a first excitation spectrum region where excitation intensity increases with increasing wavelength around a peak wavelength of the semiconductor light emitting element, the second phosphor having a second excitation spectrum region where excitation intensity is flat or decreases with respect to increasing wavelength around the peak wavelength of the semiconductor light emitting element, the third phosphor having a fourth excitation spectrum region where excitation intensity increases with increasing wavelength around a peak wavelength of the semiconductor light emitting element, the fourth phosphor having a fifth excitation spectrum region where excitation intensity is flat or decreases with respect to increasing wavelength around the peak wavelength of the semiconductor light emitting element, the first excitation spectrum being deferent from the fourth excitation spectrum, and the second excitation spectrum being different from the fifth excitation spectrum.

DETAILED DESCRIPTION OF THE INVENTION

An embodiment of the invention will now be described with reference to the drawings.

Figure 1:
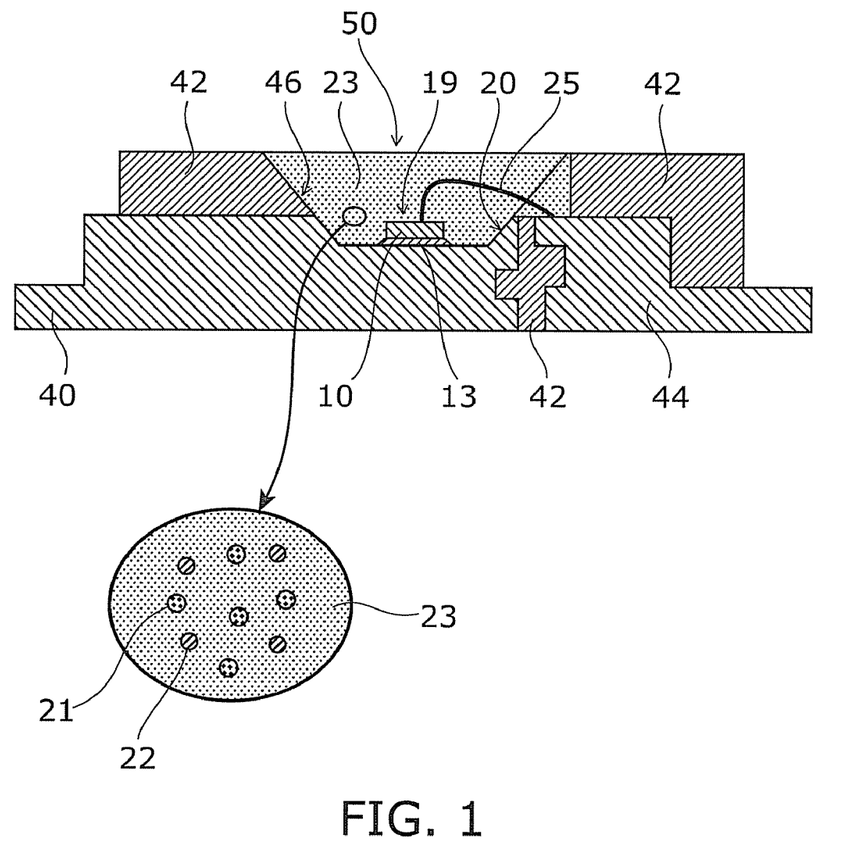
FIG. 1 is a schematic cross-sectional view of a semiconductor light emitting device according to this embodiment.

FIG. 1 is a schematic cross-sectional view showing a semiconductor light emitting device according to the embodiment of the invention. A semiconductor light emitting element 10 is bonded onto a first lead 40 with silver paste 13 or the like. The first lead 40 is provided with a first recess 19. The semiconductor light emitting element 10 is bonded to the bottom surface of the first recess 19.

An electrode provided on the upper surface of the semiconductor light emitting element 10 is connected to a second lead 44 by a bonding wire 25. The first lead 40 and the second lead 44, made of metal, are buried with a thermoplastic resin 42, for example.

In the upper portion of the thermoplastic resin 42, a second recess 50 is provided so as to continue to the first recess 19. Inside the thermoplastic resin 42, a sloped reflector 46 is provided. The reflector 46 and the inner sidewall 20 of the first recess 19 reflect upward the emitted light from the semiconductor light emitting element 10 and the light wavelength-converted by SOSE phosphor 21 and YAG phosphor 22. A mixed color can be obtained by the semiconductor light emitting element 10 and the wavelength-converted light.

A sealing resin 23 such as silicone resin mixed with SOSE and YAG phosphor 21, 22 is provided in the first recess 19 of the first lead 40 and above the semiconductor light emitting element 10. It is assumed that the semiconductor light emitting element 10 is made of a nitride material having a peak wavelength of 440 to 490 nm.

The semiconductor light emitting element 10 includes a quantum well structure made of compound semiconductor thin films. It is not easy to control the composition and thickness of a heterojunction of compound semiconductor thin films having a thickness of approximately several nm. Around the peak wavelength, the wavelength may vary ±5 nm or more. Furthermore, the peak wavelength of the semiconductor light emitting element 10 varies to the long-wavelength side due to temperature increase.

On the other hand, the excitation intensity of the SOSE phosphor 21 emitting yellow light decreases with increasing wavelength. Thus, if the peak wavelength of the semiconductor light emitting element 10 varies to the long-wavelength side, and the associated decrease in excitation intensity of SOSE phosphor 21 is added thereto, then the chromaticity variation of the semiconductor light emitting device increases. In this embodiment, SOSE and YAG phosphor 21, 22 are mixedly disposed. Hence the chromaticity variation can be reduced even if the peak wavelength of the semiconductor light emitting element 10 varies to the long-wavelength side.

Next, the operation for mixed phosphors is described in detail.

Figure 2A:
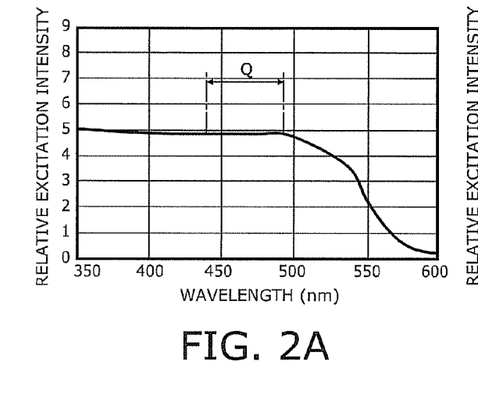
FIGS. 2A through 2E show graphs illustrating the excitation spectrum of phosphors used in the semiconductor light emitting device according to the embodiment of the invention.
Figure 2B:
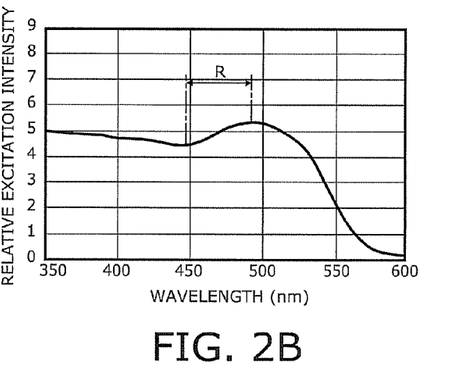
Figure 2C:
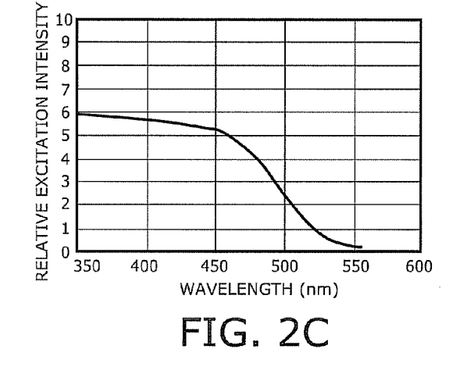
Figure 2D:
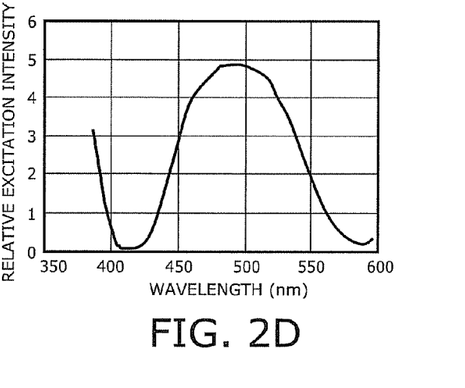
Figure 2E:
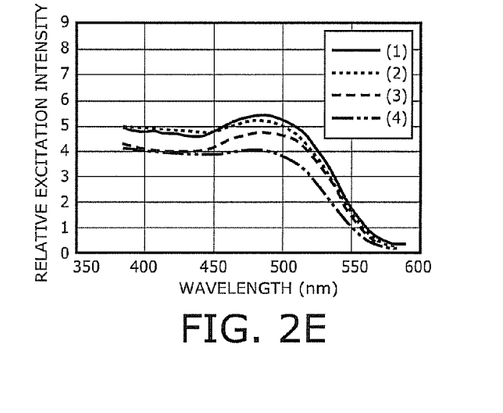

FIG. 2A through 2E show graphs illustrating the excitation spectrum of phosphors provided in the semiconductor light emitting device according to the embodiment of the invention. FIGS. 2A and 2B correspond to the phosphors used in this embodiment where two types of phosphors having different compositions are mixed, FIG. 2C corresponds to a phosphor made of silicate, FIG. 2D corresponds to a phosphor made of YAG (yttrium aluminum garnet), and FIG. 2E shows excitation spectra with the mixing ratio varied. The vertical axis represents relative excitation intensity, and the horizontal axis represents wavelength (nm). The phosphor made of silicate may be SOSE (strontium orthosilicate europium), for example.

As shown in FIG. 2C, SOSE, a yellow phosphor made of Eu-activated alkaline-earth metal silicate, has an excitation intensity that begins to gradually decrease at 350 nm, then begins to more sharply decrease around 450 nm, or blue light, and falls below 10% of that at 350 nm around 550 nm. In the semiconductor light emitting element 10 using only such SOSE as its phosphor, if its peak wavelength exceeds 450 nm due to wavelength variation, then long-wavelength components increase in the wavelength distribution of blue light, which is transmitted without contribution to excitation, because the excitation intensity becomes lower and lower as wavelength increases. Consequently, the decrease in excitation intensity of yellow phosphor is accompanied by the chromaticity variation due to the increase of long-wavelength components in blue light. Thus the chromaticity variation further increases.

The wavelength at which the emission intensity of the semiconductor light emitting element 10 is maximized is called the peak wavelength. On the other hand, the wavelength corresponding to a single wavelength perceived by a human eye is called the dominant wavelength, which may be different from the peak wavelength.

The emitted light from the semiconductor light emitting element 10 is incident on the phosphor. Part of the incident light is absorbed by the phosphor, and the rest is reflected. Because of the wavelength dependence of the absorption spectrum, the spectrum of the reflected light is different from the original spectrum of the semiconductor light emitting element 10. The dominant wavelength of the mixed light of this reflected light and the emitted light of the semiconductor light emitting element 10 not incident on the phosphor varies depending on the excitation and absorption spectrum shape of the phosphor. For example, if the excitation spectrum of the phosphor is similar in shape to its absorption spectrum, the dominant wavelength of the mixed light varies to the short-wavelength side relative to the peak wavelength in the region where the spectrum increases with wavelength, and varies to the long-wavelength side relative to the peak wavelength in the region where the spectrum decreases with increasing wavelength.

Here, the composition formula of SOSE is illustratively expressed by $(Me_{1-y}Eu_y)_2SiO_4: Eu^{2+}$ (where Me is at least one alkaline-earth metal element selected from Ba, Sr, Ca, and Mg, and $0<y\leqq1$).

On the other hand, as shown in FIG. 2D, the yellow phosphor made of YAG phosphor has an excitation spectrum that nearly vanishes around 380 nm, increases in excitation intensity with increasing wavelength, peaks around 450 nm, and nearly vanishes again around 550 nm. The composition of this YAG is illustratively expressed by $(Y,Gd)_3(Al,Ga)_5O_{12}:Ce^{3+}$. It is noted that Ce-activated garnet structures, which form a broader category including YAG, may also be used. Ce-activated garnet structures other than YAG include $Tb_3Al_5O_{12}:Ce^{3+}$ (TAG) and $Ca_3Sc_2Si_3O_{12}:Ce^{3+}$ (CSS). Furthermore, it is also possible to use europium and samarium activated lanthanum oxysulfide $(La_2O_2S:Eu^{2+},Sm^{2+})$ and europium-activated lanthanum oxysulfide $(La_2O_2S:Eu^{2+})$.

The semiconductor light emitting device according to this embodiment having an excitation spectrum illustrated in FIG. 2A or 2B is obtained by dispersing SOSE phosphor of FIG. 2C and YAG phosphor of FIG. 2D in the sealing resin. In the case of FIG. 2A, the excitation spectrum of phosphors can be made flat up to around 490 nm, approximately 40 nm longer than for SOSE of FIG. 2C. Consequently, if the upper limit of the peak wavelength of the semiconductor light emitting element falls within the flat excitation spectrum region Q ranging from 440 to 490 nm, the chromaticity variation can be reduced relative to the case of using SOSE phosphor only.

FIG. 2E shows excitation spectra with the mixing ratio of SOSE and YAG phosphor varied. In the order of (1) to (4), the proportion of YAG phosphor decreases, and the peak around 450 nm decreases. In (4), the excitation spectrum is generally flat in the wavelength range of 440 to 490 nm.

Figure 3:
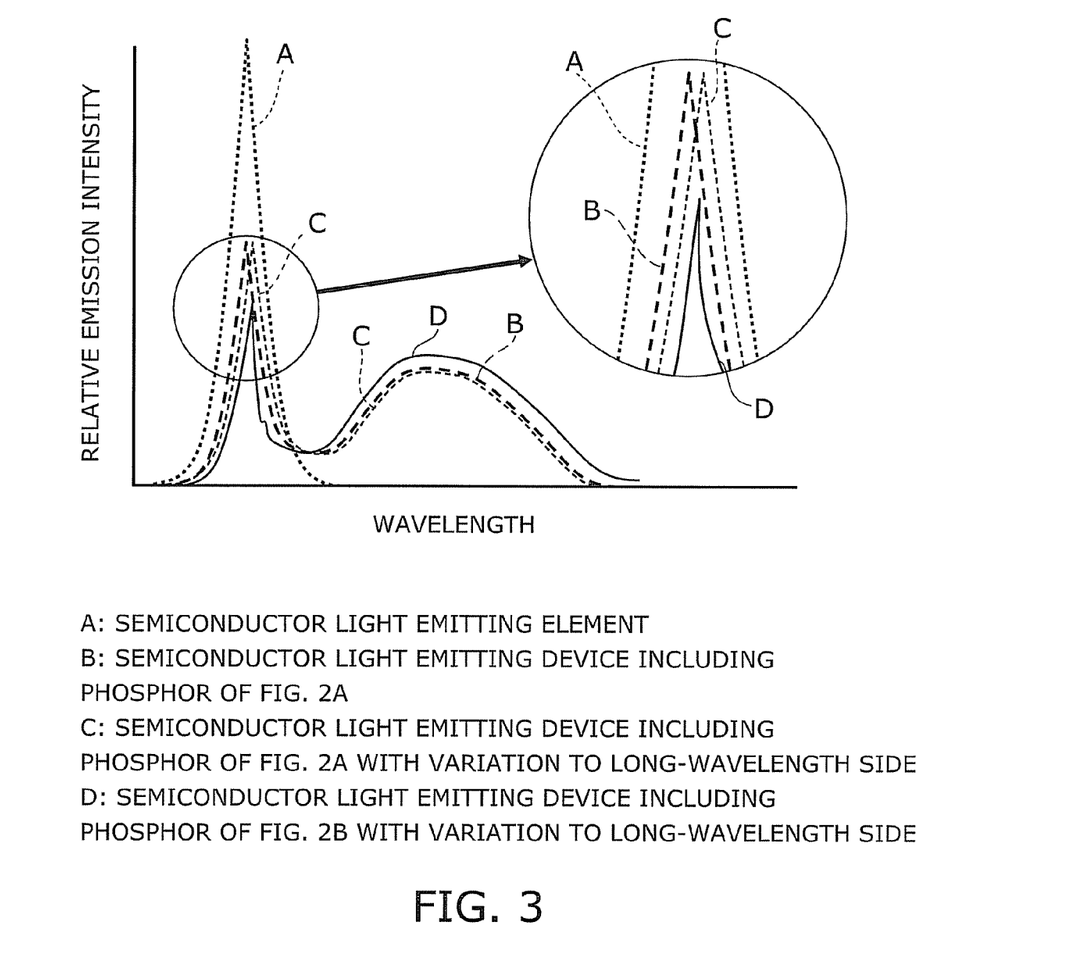
FIG. 3 illustrates an emission spectrum of the semiconductor light emitting device according to this embodiment.

FIG. 3 schematically shows an emission spectrum of the semiconductor light emitting device according to the embodiment of the invention. The vertical and horizontal axis represent emission intensity and wavelength, respectively. The dotted line A represents the emission spectrum of the semiconductor light emitting element, and the dashed line B represents the emission spectrum of the semiconductor light emitting device composed of the semiconductor light emitting element represented by A and the phosphor of FIG. 2A.

The semiconductor light emitting element is assumed to be a blue LED (light emitting diode) illustratively made of an InGaAlN-based material and having a peak wavelength in the range of 440 to 490 nm. The peak wavelength determined within this range in accordance with the specification varies, illustratively in the range of ±10 nm around the peak wavelength, due to temperature variation and manufacturing parameter dispersion. Part of the emitted light from the semiconductor light emitting element 10 is absorbed by phosphors 21, 22 used in this embodiment and is wavelength-converted into yellow light by excitation. Because blue light is absorbed by phosphors 21, 22, the emission intensity of the semiconductor light emitting device around the peak wavelength is as shown by the dashed line B, lower than the emission intensity A of the semiconductor light emitting element 10 shown by the dotted line.

The dashed line C in FIG. 3 represents a spectrum of the semiconductor light emitting device shown by the dashed line B where the peak wavelength of the semiconductor light emitting element 10 is varied to the long-wavelength side. In the case of the dashed line C, it is assumed that, around the peak wavelength of the semiconductor light emitting element 10, the excitation spectrum of phosphors falls within the nearly flat region Q as shown in FIG. 2A.

Next, the operation of this embodiment is described with reference to the chromaticity diagram.

Figure 4A:
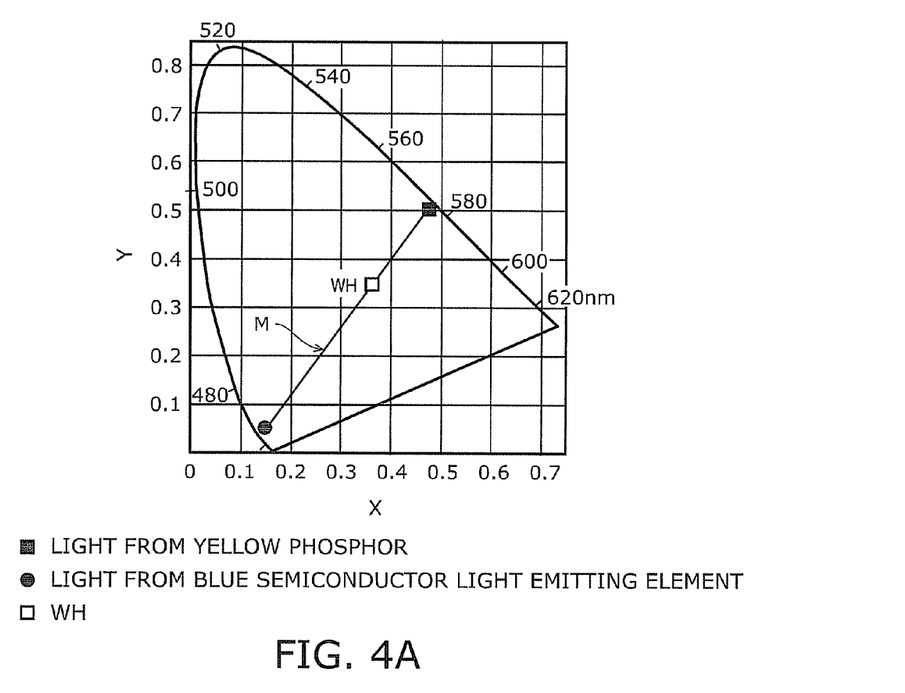
FIGS. 4A through 4C are chromaticity diagrams illustrating the chromaticity variation of the semiconductor light emitting device.
Figure 4B:
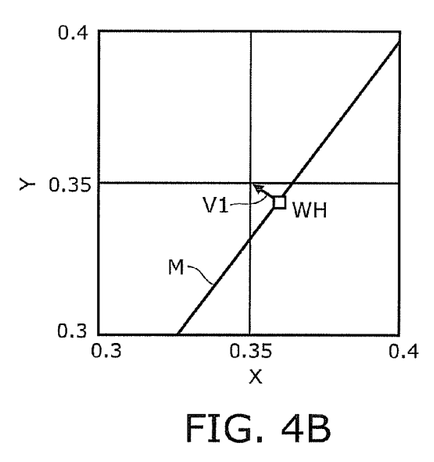
Figure 4C:
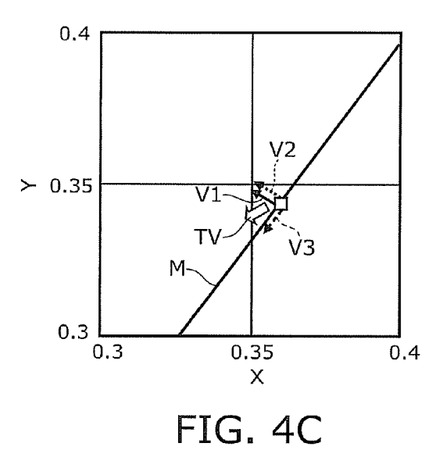

FIGS. 4A through 4C are chromaticity diagrams compliant with the CIE (Commission Internationale de l'Eclairage) standard. FIG. 4A is the entire chromaticity diagram, FIG. 4B is a partially enlarged diagram around the mixed color, and FIG. 4C is a partially enlarged diagram for SOSE phosphor only. In FIG. 4, the curved portion is the spectral trace for an emission wavelength of 380 to 780 nm, and the straight line connecting both end points is the pure-violet trace.

In FIG. 3, when the blue semiconductor light emitting element has a peak wavelength of 450 nm, its xy coordinates in the CIE diagram are expressed as (0.15, 0.03). The yellow phosphor has a flat excitation spectrum Q in FIG. 2A, and its xy coordinates are expressed as (0.480, 0.505). Their mixed color corresponds to the point WH located on the line M connecting both sets of coordinates and represented by coordinates (0.36, 0.34). By varying the ratio between blue light and yellow light, the mixed color can be made close to white light or incandescent bulb color.

Here, if the peak wavelength of the semiconductor light emitting element 10 is varied to the long-wavelength side, the blue light varies to the long-wavelength side along the spectral trace, and the point WH of the mixed color accordingly varies in the direction of arrow V1 in FIG. 4B. However, other variation factors are small because of the flat excitation spectrum.

On the other hand, as shown in FIG. 4C, in the case where the yellow phosphor consists only of SOSE of FIG. 2C, besides the variation V1 associated with the wavelength variation of the semiconductor light emitting element 10, the variation V2 corresponding to the variation of the dominant wavelength to the long-wavelength side and the variation V3 due to the decrease of yellow emission intensity associated with the decrease of excitation intensity are added. Consequently, addition of these variations results in increasing the chromaticity variation as shown by TV. In contrast, this embodiment can reduce the chromaticity variation as shown in FIG. 4B.

In FIG. 3, the solid line D represents a spectrum of the semiconductor light emitting device shown by the dashed line B where the peak wavelength of the semiconductor light emitting element 10 is varied to the long-wavelength side. In the case of the solid line D, it is assumed that the wavelength upper limit of the semiconductor light emitting element 10 falls within the excitation spectrum region R shown in FIG. 2B where the emission intensity of phosphor increases with wavelength. In this excitation spectrum region, the emitted light from the semiconductor light emitting element 10 is increasingly absorbed by the phosphor toward the long-wavelength side.

Figure 5:
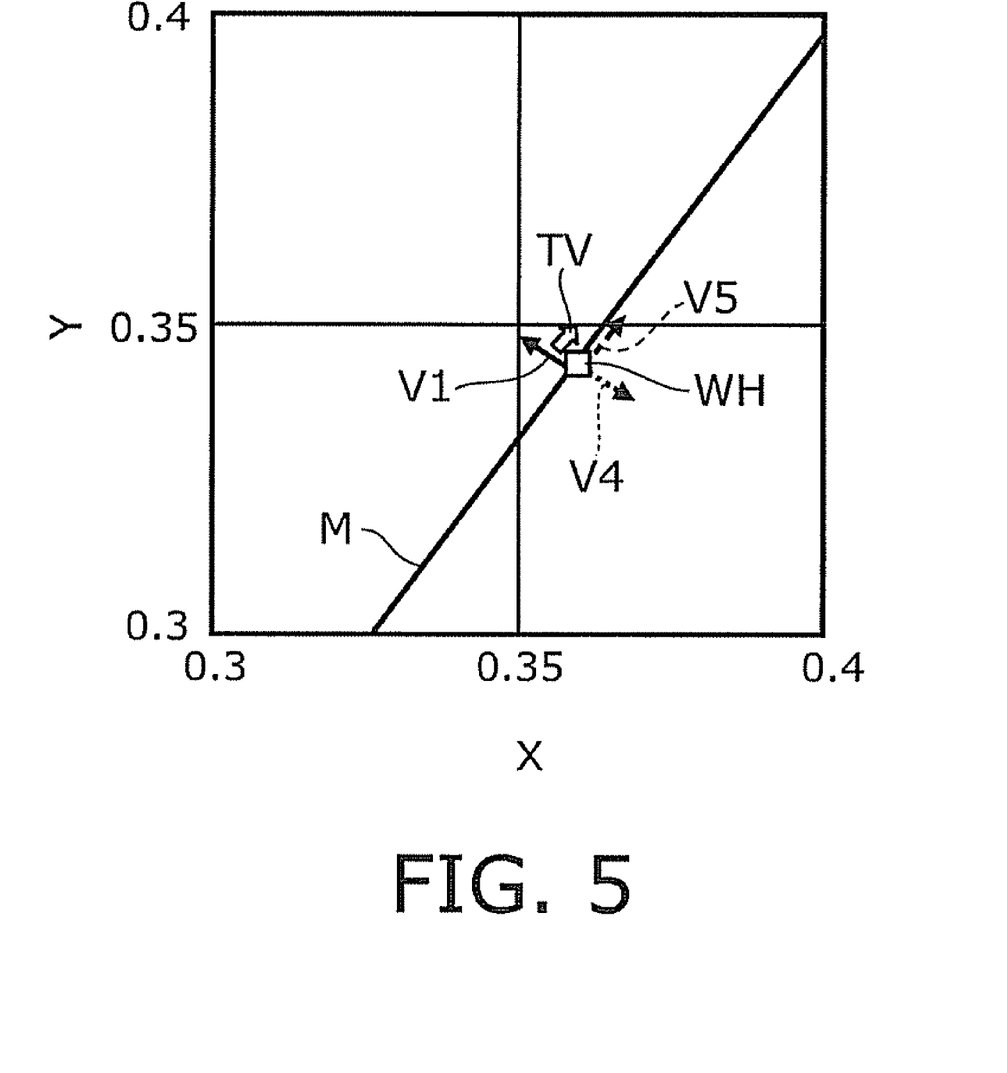
FIG. 5 is a partially enlarged chromaticity diagram of the semiconductor light emitting device according to this embodiment.

FIG. 5 is a partially enlarged chromaticity diagram illustrating the operation corresponding to the solid line D in FIG. 3. In the solid line D, long-wavelength components in blue light decrease by the decreased amount of blue light that is not absorbed but transmitted through the phosphor without contribution to excitation, and the dominant wavelength of the mixed color of the light from the semiconductor light emitting element 10 and the reflected light from the phosphor varies to the short-wavelength side (V4).

More specifically, potential variation in the direction V1 of the peak wavelength of the semiconductor light emitting element 10 is compensated for by the reverse variation V4, and the variation of the point WH is reduced. In this case, in the increasing excitation spectrum region R, the intensity of emission from the yellow phosphor increases, and the emission intensity in the yellow wavelength band is higher on D than on B and C, causing variation in the direction V5. However, this effect is as small as the difference between the solid line D and the dashed line C in FIG. 3.

Next, the wavelength variation due to the temperature variation of the semiconductor light emitting element 10 is described. Variation in the peak wavelength of the semiconductor light emitting element 10 is attributed to the temperature variation of the device as well as to the variation of device structure parameters.

Figure 6:
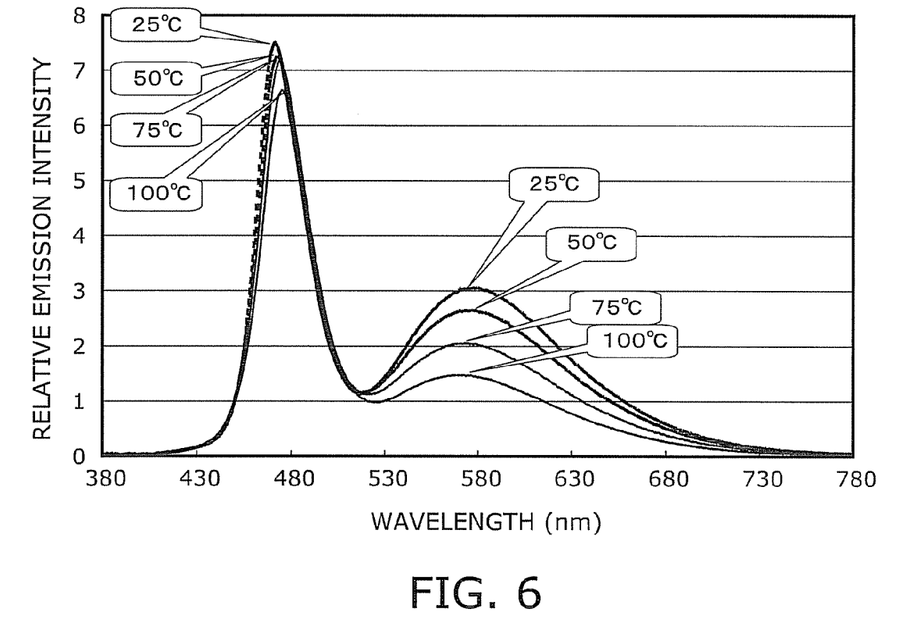
FIG. 6 is a graph showing the temperature dependence of the emission spectrum of the semiconductor light emitting device.

FIG. 6 is a graph showing the temperature dependence of the emission spectrum of the semiconductor light emitting device based on SOSE phosphor. The peak wavelength of the semiconductor light emitting element 10 varies to the long-wavelength side due to temperature increase. Furthermore, for example, the emission intensity of yellow light at 100° C. is lower than at 25° C.

Figure 7:
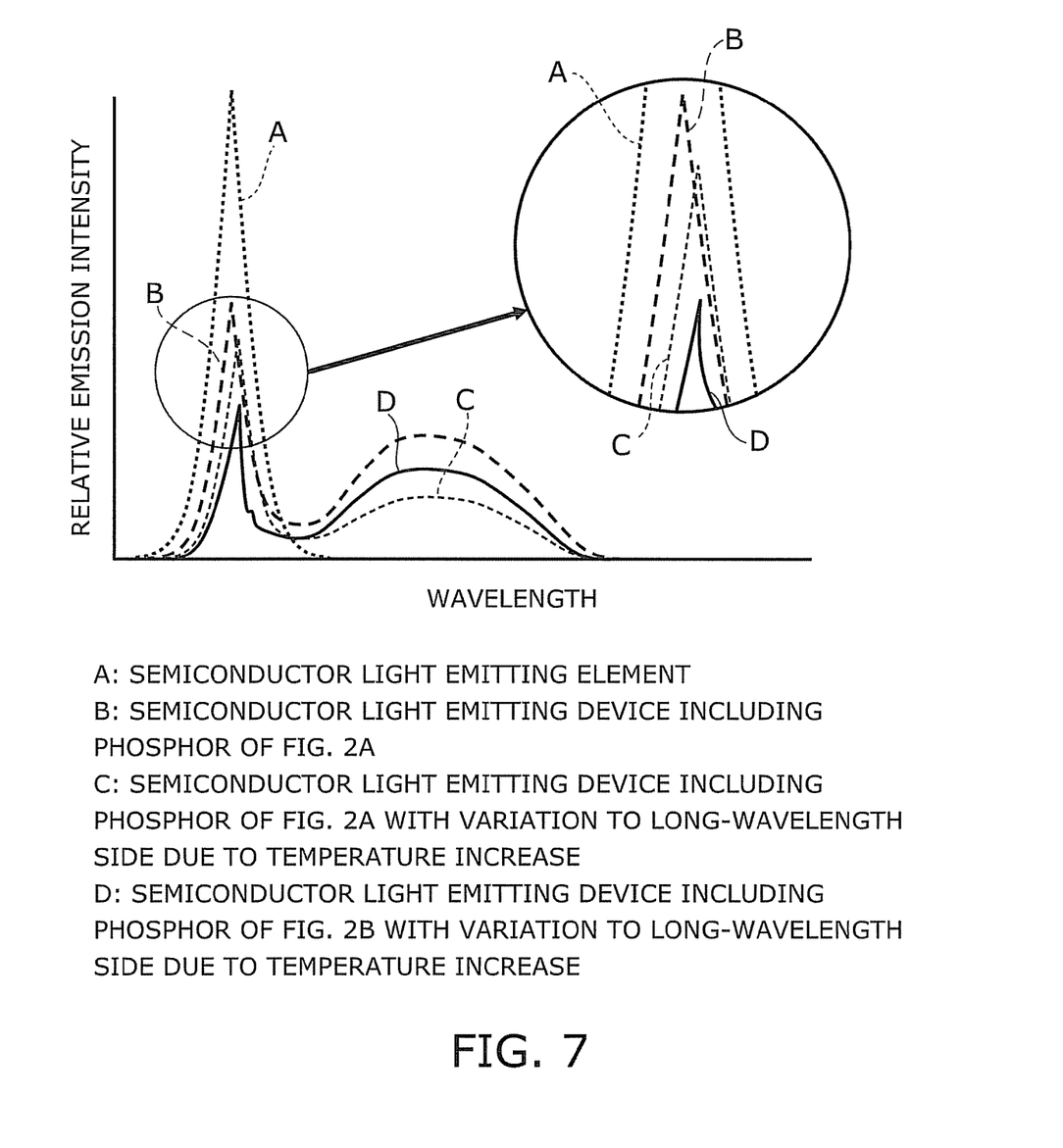
FIG. 7 illustrates another emission spectrum of the semiconductor light emitting device according to this embodiment.

FIG. 7 illustrates the temperature variation of the emission spectrum of the semiconductor light emitting device according to the embodiment of the invention. The dotted line A represents the emission spectrum of the semiconductor light emitting element, and the dashed line B represents the emission spectrum of the semiconductor light emitting device composed of the semiconductor light emitting element represented by A and the phosphor.

The dashed line C in FIG. 7 represents an emission spectrum of the semiconductor light emitting device shown by the dashed line B where the peak wavelength of the semiconductor light emitting element 10 is varied to the long-wavelength side due to temperature increase. In this case, it is assumed that the excitation spectrum of phosphors is nearly flat with respect to wavelength as shown in FIG. 2A.

Figure 8:
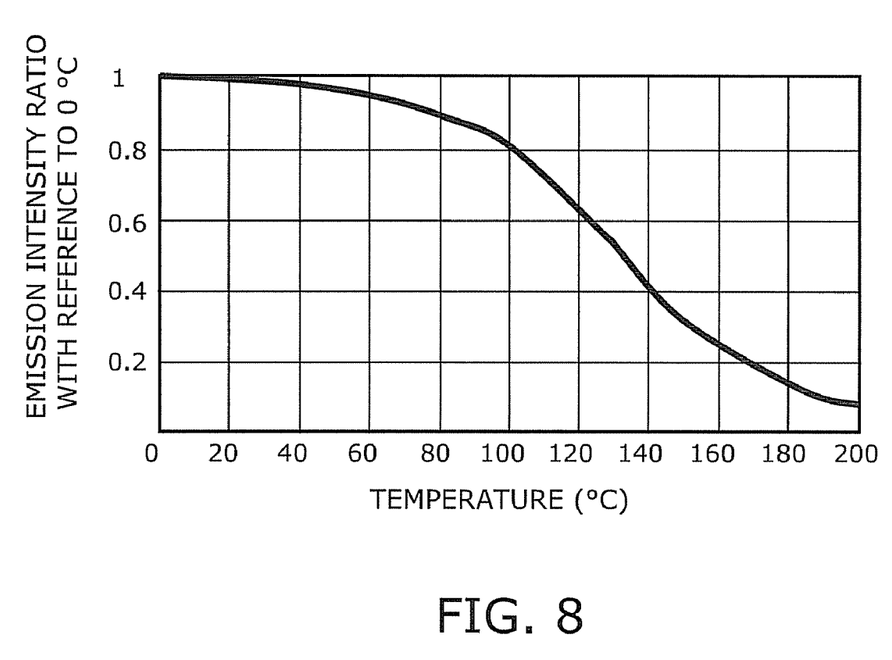
FIG. 8 is a graph showing the temperature dependence of emission intensity of the yellow phosphor.

In general, the emission intensity of phosphor decreases as the temperature increases. FIG. 8 is a graph showing the temperature dependence of emission intensity of the yellow phosphor made of SOSE. The vertical axis represents the emission intensity ratio with reference to 0° C., and the horizontal axis represents temperature (° C.). When the phosphor reaches 100° C., the emission intensity ratio decreases to approximately 82%.

The peak wavelength of the semiconductor light emitting element 10 varies to the long-wavelength side due to temperature increase. For example, in the operating range, it may vary approximately 5 nm to the long-wavelength side compared to at room temperature. Because the excitation intensity of yellow phosphor decreases due to temperature increase as shown in FIG. 8, the dashed line C is lower than the dashed line B. If the peak wavelength of the semiconductor light emitting element 10 has a maximum within the flat region Q of 440 to 490 nm, the chromaticity variation can be reduced relative to the case of using SOSE phosphor only.

Figure 9:
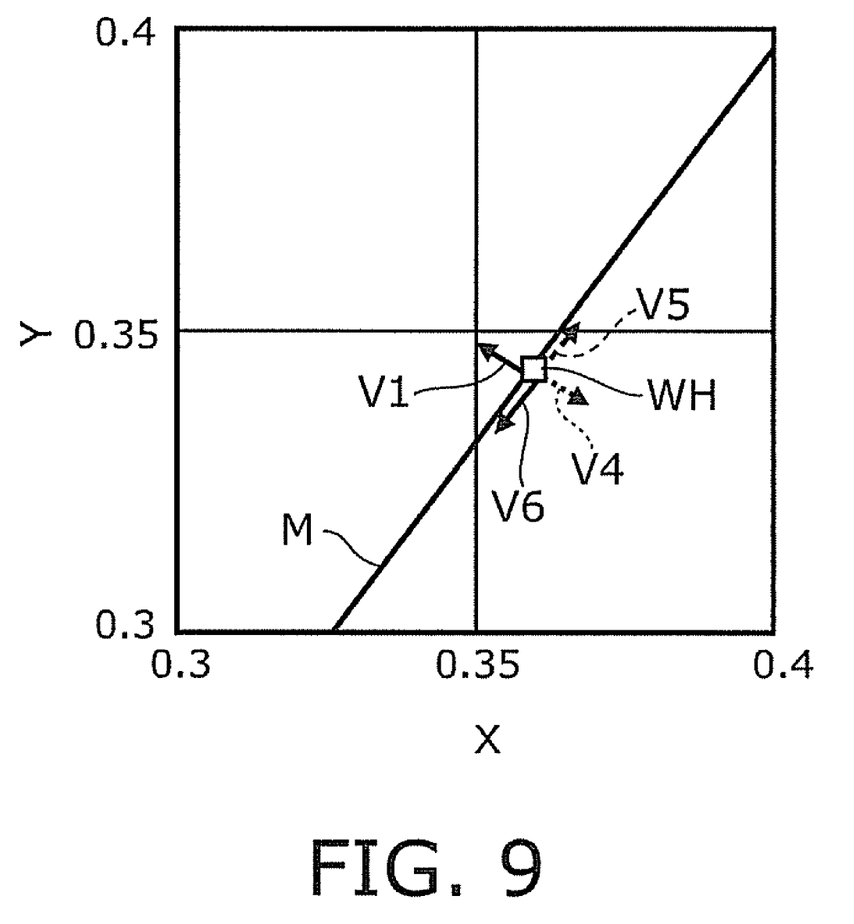
FIG. 9 is a partially enlarged chromaticity diagram of the semiconductor light emitting device according to this embodiment.

The solid line D in FIG. 7 represents a spectrum of the semiconductor light emitting device shown by the dashed line B where the peak wavelength of the semiconductor light emitting element 10 is varied to the long-wavelength side due to high temperature. In this case, it is assumed that the excitation spectrum of phosphors has a region R increasing toward the long-wavelength side as shown in FIG. 2B. As shown in the partially enlarged chromaticity diagram of FIG. 9, the wavelength of the semiconductor light emitting element 10 varies to the long-wavelength side due to temperature increase, causing potential variation V1 on the chromaticity diagram. If the excitation intensity of phosphor increases, the dominant wavelength of the mixed light of the light from the semiconductor light emitting element 10 and the reflected light from the phosphor varies to the short-wavelength side (V4) by the decreased amount of blue light transmitted without absorption.

Furthermore, by the excitation spectrum of FIG. 2A, the excitation intensity of phosphor further increases (V5), compensating for the decrease of yellow phosphor excitation intensity due to temperature increase (V6). Thus the emission intensity can be made higher than the dashed line C, and the chromaticity variation can be reduced. That is, with regard to wavelength and yellow emission intensity, the reverse variation can be used to further reduce the overall chromaticity variation.

The foregoing describes the case where absorption and excitation in the phosphor are similar in spectral shape. However, the wavelength dependence of the excitation spectrum can be different from that of the absorption spectrum. More specifically, the intensity of emission from phosphor depends on the quantum efficiency. Hence, in the YAG phosphor, for example, the absorption spectrum can include a region increasing with wavelength, whereas the excitation spectrum can be made flat by increasing the composition ratio of Ce activator to decrease the quantum efficiency. Consequently, in the partially enlarged chromaticity diagram of FIG. 5 corresponding to the solid line D in FIG. 3, for example, the dominant wavelength can be varied to the short-wavelength side (V4) while restraining the yellow emission intensity variation V5, and the overall chromaticity variation can be reduced.

Next, the case of using oxynitride phosphor is described. The SOSE phosphor can be replaced by oxynitride phosphor. The oxynitride phosphor is illustratively expressed by the composition formula $MeSi_2O_2N_2$:Eu (where Me includes at least one selected from Ca, Sr, and Ba) or $Me_2Si_5N_8$:Eu (where Me includes at least one selected from Ca, Sr, and Ba). By mixing such oxynitride phosphor with YAG, a semiconductor light emitting device with reduced chromaticity variation can be obtained.

Figure 10A:
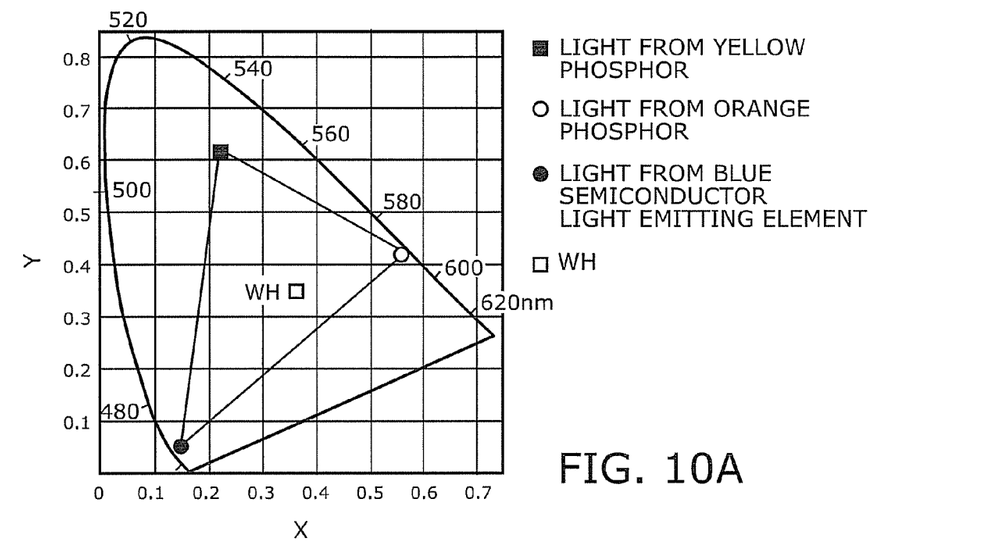
FIGS. 10A through 10C illustrate diagrams to explain semiconductor light emitting device according to a modified example of this embodiment.
Figure 10B:
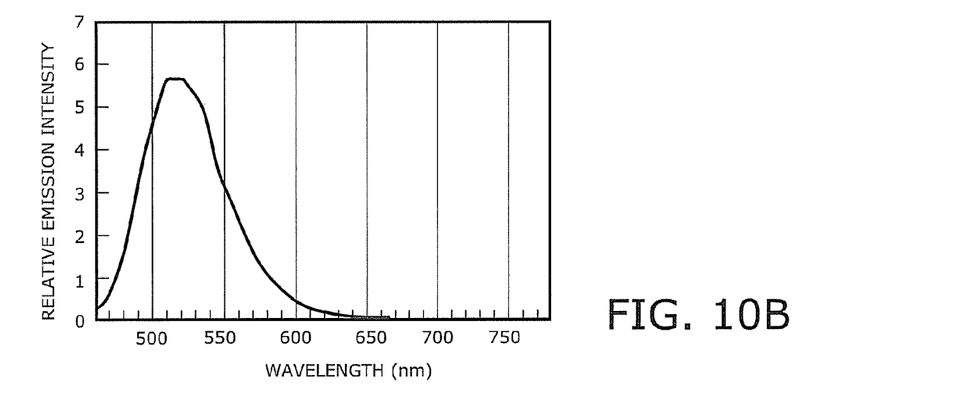
Figure 10C:
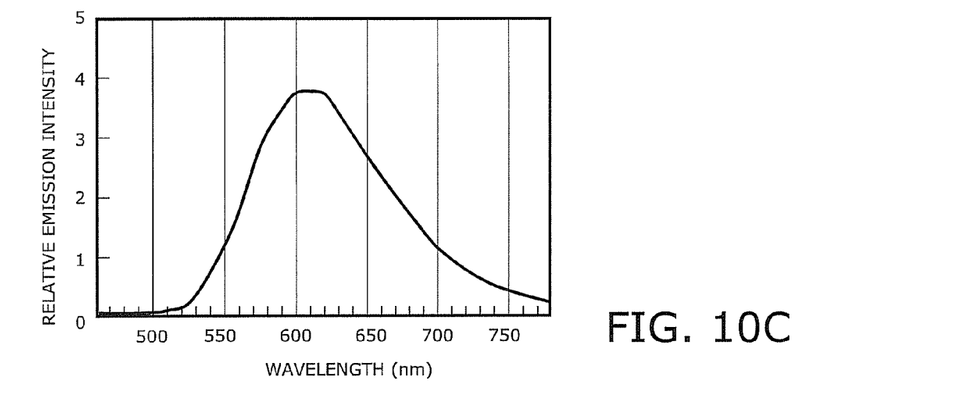

FIGS. 10A through 10C illustrate diagrams to explain illustrates a semiconductor light emitting device according to a modified example of the embodiment. FIG. 10A is a chromaticity diagram, FIG. 10B illustrates an emission spectrum of an yellow-green phosphor, and FIG. 10C illustrates an emission spectrum of an orange phosphor.

In this modified example, the yellow-green and orange phosphors are mixed. As shown in FIG. 10A, xy coordinates of a wavelength-converted light by the yellow-green phosphor from the light of the semiconductor light emitting device 10 are expressed as (0.222, 0.609), for example. Furthermore, xy coordinates of a wavelength-converted light by the orange phosphor from the light of the semiconductor light emitting device 10 are expressed as (0.567, 0.429), for example. The emission spectrum of the yellow-green phosphor has a peak intensity in the wavelength range from 510 nm to 520 nm and includes a green light region as illustrated in FIG. 10B. Also, the emission spectrum of the orange phosphor has a peak intensity around 600 nm as illustrated in FIG. 10C. The point WH of the mixed light is obtained if the yellow-green phosphor light, the orange phosphor light, and the blue LED light are mixed. The mixed light color can be made close to white or incandescent bulb color by appropriately adjusting the mixing ratio of these lights.

The yellow-green phosphor can be obtained by appropriately selecting the mixing ratio between SOSE and YAG phosphor, and each constitution. The orange phosphor can be obtained by appropriately selecting the mixing ratio between SOSE and YAG phosphor, and each constitution. The emission spectrum resulting from the yellow-green phosphor and the orange phosphor differs from that illustrated in FIG. 3.

Figure 11A:
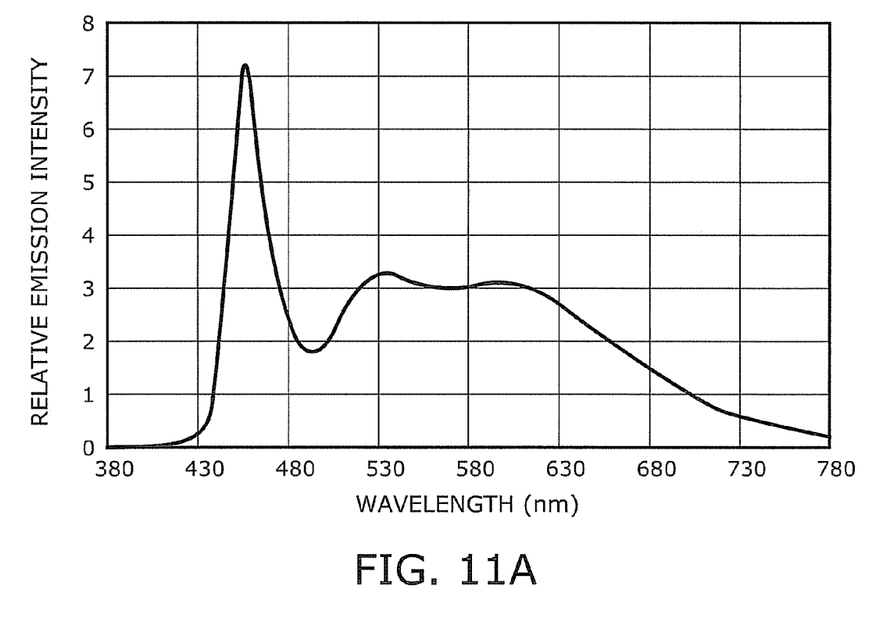
FIGS. 11A through 11B illustrate an emission spectrum of the semiconductor light emitting device according to the modified example.
Figure 11B:
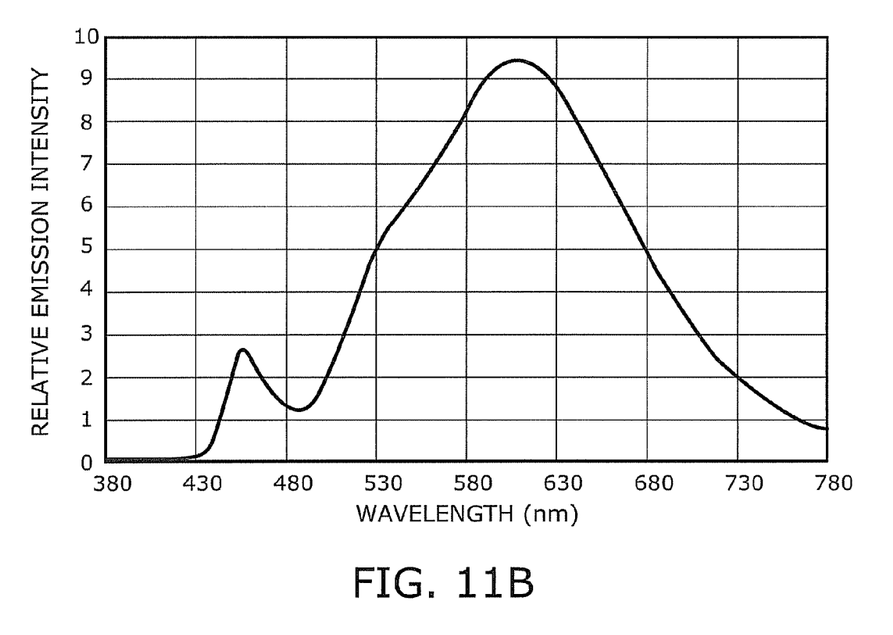

FIGS. 11A and 11B illustrate emission spectra of the semiconductor light emitting device according to the modified example. The spectrum illustrated in FIG. 11A is close to white color, and the spectrum illustrated in FIG. 11B is close to incandescent bulb color. The emission spectrum can be made nearly flat in the wide range from 520 nm to 620 nm as shown in FIG. 11A. Furthermore, as shown in FIG. 11B, the peak wavelength in the emission spectrum is around 620 nm, which is longer by approximately 50 nm than the peak wavelength of 570 nm as illustrated in FIG. 6. Thus the spectrum width shown in FIG. 11B can be made wider. As the spectrum width can be made wider by mixing the yellow-green and orange phosphor than the case where only yellow phosphor is used, the chromaticity control range can be expanded within the triangle region in the chromaticity diagram. Hence it becomes possible to improve color rendering properties, and to obtain white color close to natural light.

In this modified example, the yellow-green and orange phosphor have a YAG excitation spectrum region where excitation intensity increases with increasing wavelength around a peak wavelength of the semiconductor light emitting element, and a SOSE excitation spectrum region where excitation intensity is flat or decreases with respect to increasing wavelength of the semiconductor emitting element, respectively. Hence the chromaticity variation can be reduced with respect to the peak wavelength fluctuation of the semiconductor light emitting element by the same mechanism as explained with reference to FIGS. 4B and 5 compared to the case where only yellow phosphor is used. Furthermore, the chromaticity variation can be reduced with respect to temperature increase by the same effect as explained with reference to FIG. 9.

In this embodiment and its modification example, the mixed excitation spectrum may include fluctuations existing within a narrower region than FWHM (Full Width Half Maximum) of the semiconductor light emitting element in the flat excitation region Q or in the increasing excitation region R. In such a case, FWHM is approximately 20 nm, for example.

In the above examples, the variation range of the center wavelength of the semiconductor light emitting element is 440 to 490 nm, and the phosphor is yellow phosphor, yellow-green, and orange. However, the invention is not limited thereto, but encompasses semiconductor light emitting elements and phosphors with other emission wavelengths.

The embodiment of the invention has been described with reference to the drawings. However, the invention is not limited to these examples. For instance, the semiconductor light emitting element and phosphors constituting the semiconductor light emitting device can be modified by those skilled in the art with regard to their material, shape, and emission characteristics, and any such modifications are encompassed within the scope of the invention as long as they do not depart from the spirit of the invention.

The invention claimed is:

1. A semiconductor light emitting device comprising:
a semiconductor light emitting element;
a first phosphor which absorbs light emitted from the semiconductor light emitting element and emits first wavelength-converted light, the first phosphor having a first excitation spectrum where excitation intensity is flat or decrease with increasing wavelength around a peak wavelength of the semiconductor light emitting element;
a second phosphor which absorbs light emitted from the semiconductor light emitting element and emits second wavelength-converted light, the second phosphor having a second excitation spectrum where excitation intensity increase with respect to increasing wavelength around the peak wavelength;
a third phosphor which absorbs light emitted from the semiconductor light emitting element and emits third wavelength-converted light, the third phosphor having a fourth excitation spectrum where excitation intensity is flat or decreases with increasing wavelength around the peak wavelength; and
a fourth phosphor which absorbs light emitted from the semiconductor light emitting element and emits fourth wavelength-converted light, the fourth phosphor having a fifth excitation spectrum where excitation intensity increases with respect to increasing wavelength around the peak wavelength,
wherein
the first excitation spectrum is different from the fourth excitation spectrum,
the second excitation spectrum is different from the fifth excitation spectrum,
excitation intensity resulting from mixing the first phosphor and the second phosphor has a sixth excitation spectrum region which is flat or increases with respect to increasing wavelength,
excitation intensity resulting from mixing the third phosphor and the fourth phosphor has a seventh excitation spectrum region which is flat or increases with respect to increasing wavelength,
the sixth excitation spectrum is different from the seventh excitation spectrum, and
an upper limit of the peak wavelength falls within both sixth and seventh excitation spectrum regions.

2. A semiconductor light emitting device comprising:
a semiconductor light emitting element;
a first phosphor which absorbs light emitted from the semiconductor light emitting element and emits first wavelength-converted light, the first phosphor having a first excitation spectrum where excitation intensity is flat or decrease with increasing wavelength around a peak wavelength of the semiconductor light emitting element;
a second phosphor which absorbs light emitted from the semiconductor light emitting element and emits second wavelength-converted light, the second phosphor having a second excitation spectrum where excitation intensity increase with respect to increasing wavelength around the peak wavelength;
a third phosphor which absorbs light emitted from the semiconductor light emitting element and emits third wavelength-converted light, the third phosphor having a fourth excitation spectrum where excitation intensity is flat or decreases with increasing wavelength around the peak wavelength; and
a fourth phosphor which absorbs light emitted from the semiconductor light emitting element and emits fourth wavelength-converted light, the fourth phosphor having a fifth excitation spectrum where excitation intensity increases with respect to increasing wavelength around the peak wavelength,
wherein
the first excitation spectrum is different from the fourth excitation spectrum,
the second excitation spectrum is different from the fifth excitation spectrum,
absorption intensity resulting from mixing the first phosphor and the second phosphor has a first absorption spectrum region which increases with wavelength,
absorption intensity resulting from mixing the third phosphor and the fourth phosphor has a second absorption spectrum region which increases with wavelength and differs from the first absorption region,
excitation intensity resulting from mixing the first phosphor and the second phosphor has an eighth excitation spectrum region which is flat with respect to wavelength,
excitation intensity resulting from mixing the third phosphor and the fourth phosphor has a ninth excitation spectrum region which is flat with respect to wavelength and different from the eighth excitation spectrum, and
an upper limit of the peak wavelength falls within both first and second absorption spectrum regions.

3. The semiconductor light emitting device according to claim 1, wherein
the first phosphor and the third phosphor include at least one of silicate and oxynitride, respectively, and
the second phosphor and the fourth phosphor include at least one of a Ce-activated garnet structure, europium and samarium activated lanthanum oxysulfide, and europium-activated lanthanum oxysulfide, respectively.

4. The semiconductor light emitting device according to claim 3, wherein the silicate is expressed by a composition formula $(Me_{1-y}Eu_y)_2SiO_4:Eu^{2+}$ (where Me is at least one alkaline-earth metal element selected from Ba, Sr, Ca, Mg, and $0<y\leqq1$), and the Ce-activated garnet structure is expressed by a composition formula $(Y,Gd)_3(Al,Ga)_5O_{12}:Ce^{3+}$.

5. The semiconductor light emitting device according to claim 2, wherein the first phosphor and the third phosphor include at least one of silicate and oxynitride, respectively, and the second phosphor and the fourth phosphor include at least one of a Ce-activated garnet structure, europium and samarium activated lanthanum oxysulfide, and europium-activated lanthanum oxysulfide, respectively.

6. The semiconductor light emitting device according to claim 5, wherein the silicate is expressed by a composition formula $(Me_{1-y}Eu_y)_2SiO_4:Eu^{2+}$ (where Me is at least one alkaline-earth metal element selected from Ba, Sr, Ca, Mg, and $0<y\leqq1$), and the Ce-activated garnet structure is expressed by a composition formula $(Y,Gd)_3(Al,Ga)_5O_{12}:Ce^{3+}$.

7. The semiconductor light emitting device according to claim 3, wherein the peak wavelength of the semiconductor light emitting element is in a range from 440 to 490 nm.

8. The semiconductor light emitting device according to claim 5, wherein the peak wavelength of the semiconductor light emitting element is in a range of 440 to 490 nm.

* * * * *